US006734685B2

(12) United States Patent
Rudrich

(10) Patent No.: US 6,734,685 B2
(45) Date of Patent: May 11, 2004

(54) TOUCH SENSOR, SANITARY FITTING WITH TOUCH SENSOR AND METHOD OF DETECTING A TOUCH ON AN ELECTRICALLY CONDUCTIVE SURFACE

(75) Inventor: Hans-Peter Rudrich, München (DE)

(73) Assignee: Friedrich Grohe AG & Co. KG, Hemer (DE)

( * ) Notice: Subject to any disclaimer, the term of this patent is extended or adjusted under 35 U.S.C. 154(b) by 0 days.

(21) Appl. No.: 09/799,530

(22) Filed: Mar. 7, 2001

(65) Prior Publication Data

US 2001/0022352 A1 Sep. 20, 2001

(30) Foreign Application Priority Data

Mar. 8, 2000 (DE) ......................................... 100 11 229

(51) Int. Cl.$^7$ ............................................... G01R 27/26
(52) U.S. Cl. ...................................... 324/661; 324/662
(58) Field of Search ...................... 307/116; 324/654, 324/692

(56) References Cited

U.S. PATENT DOCUMENTS

| 4,219,740 A | * | 8/1980 | Little | 324/654 |
| 5,008,497 A | * | 4/1991 | Asher | 178/18.05 |
| 5,012,124 A | * | 4/1991 | Hollaway | 307/116 |
| 5,180,978 A | * | 1/1993 | Postma | 324/654 |
| 5,783,875 A | * | 7/1998 | Jaros | 324/692 |

FOREIGN PATENT DOCUMENTS

JP          59-75547     *  4/1984

* cited by examiner

Primary Examiner—N. Le
Assistant Examiner—Vincent Q. Nguyen
(74) Attorney, Agent, or Firm—Kanesaka & Takeuchi

(57) ABSTRACT

A touch sensor with a sensor surface insulated with respect to ground potential, the sensor surface being connected via a measuring resistor to an a.c. voltage generator, and the voltage across the measuring resistor being used as a difference measuring signal. At least one touch sensor can advantageously be integrated in a sanitary fitting and used to control solenoid valves on water feeds of the fitting. An operating element of the fitting is used as a sensor surface and is connected via a connecting cable to control electronics of the sensor. A method of detecting a touch on an electrically conductive surface, a capacitive touch sensor being used which detects the complex conductance of a human body.

The touch detection is carried out by measuring and evaluating a current flow in the direction from the sensor to the person who touches the sensor surface and/or in the direction from the person into the sensor.

14 Claims, 5 Drawing Sheets

$U_{Rs} = A - B$ $A = U_o$ $B = U_a$ $U_{Rs} = U_o - U_a$ $U_{Rs} = R_s * I_a$ $$U_s \Big|_{S1 = ON} = \frac{R_s}{R_s + (R_m + 1/jwC_m)} \cdot U_o$$

TOUCH SENSOR, SANITARY FITTING WITH TOUCH SENSOR AND METHOD OF DETECTING A TOUCH ON AN ELECTRICALLY CONDUCTIVE SURFACE

BACKGROUND OF THE INVENTION

Modern electronically controlled appliances have so called capacitive sensors which make it possible to control the appliance by bringing the hand close to or touching a sensor surface. For example, touch-sensitive monitors are known, touching which at a suitable position controls the execution of a computer program displayed on the monitor.

For example, modem electrically or electronically controlled sanitary fittings are additionally based on highly sophisticated, comprehensive electronic circuit arrangements (microprocessors/microcontrollers), which are supplied with energy either by a battery or via a mains voltage converter. Such a control system for sanitary fittings generally has an electrical signal transmitter, in the simplest case a mechanical switch, whose actuation causes the electronic control system to initiate the function of the fitting desired by the user. For example, mention should be made here of actuating a piezoelectric switch in an electronic shower control system, with whose actuation the user can control the water flow, that is to say can start it or possibly also stop it. In addition, in sanitary fittings, infrared reflective light barriers are widespread as signal transmitters for electronic circuit arrangements and, when an object, body, part of a body, etc., is detected in the detection range, a corresponding electrical signal is transmitted by the barriers to a microprocessor control system. Also known are electronically controlled fitting designs which, in addition to a first signal transmitter for the basic function of the fitting, have a further signal transmitter to activate and deactivate further special functions or to change operating parameters. For example, DE-195 08 644 describes the functioning of a control system having a touch switch that is integrated in the fitting and accessible from the outside.

However, because of their low mechanical strength, mechanical signal transmitters for controlling electronic fittings, in particular, are easy to damage from outside the fitting and are therefore susceptible to vandalism. In addition, the mechanical signal transmitters are relatively susceptible to wear, because of contact wear, and therefore have only a limited service life. If they are used in electronic sanitary fittings, it is also necessary to protect the mechanical switches against humidity, which requires complicated insulation and sealing measures, which makes the production of such a fitting complicated and consequently expensive.

On account of the above disadvantages of the mechanically actuated signal transmitters (switches, pushbuttons) for controlling sanitary fittings, in particular, attempts have therefore been made to replace the mechanically actuated signal transmitters by capacitive sensors which, as mentioned above, permit functional control via close approach or touch. Here, for example, reference should be made to U.S. Pat. No. 7,730,165, in which the dispensation of water from a fitting is controlled via a capacitive sensor, which detects the approach of a user to the fitting.

However, such conventional capacitive sensors require extremely complex signal processing electronics, which is associated with correspondingly high costs and a large overall volume. In addition, such capacitive sensors are very susceptible to faults with respect to electrostatic discharges, and electromagnetic irradiation and are extremely sensitive with respect to changes in the dielectric constant in the surrounding media, for example as a result of humidity, wetting, water vapor, and so on, for which reason they can be used only under certain conditions, in particular in the area of sanitary fittings, and also with the provision of correspondingly complex control electronics. In addition, the above conventional capacitive touch sensors need a low-resistance, direct connection between the basic fitting body and the protective conductor potential, which likewise complicates the installation of such fittings and makes it more expensive.

SUMMARY OF THE INVENTION

It is therefore an object of the present invention to provide a reliable touch sensor which is constructed as simply as possible and which can also be used in the area of sanitary fittings without problems and cost-effectively.

The object of the present invention is achieved by the features of the independent claims. Advantageous embodiments of the invention are mentioned in the subclaims and/or the following description, which is accompanied by schematic drawings.

DESCRIPTION OF THE PREFERRED EMBODIMENT

Figure 1:
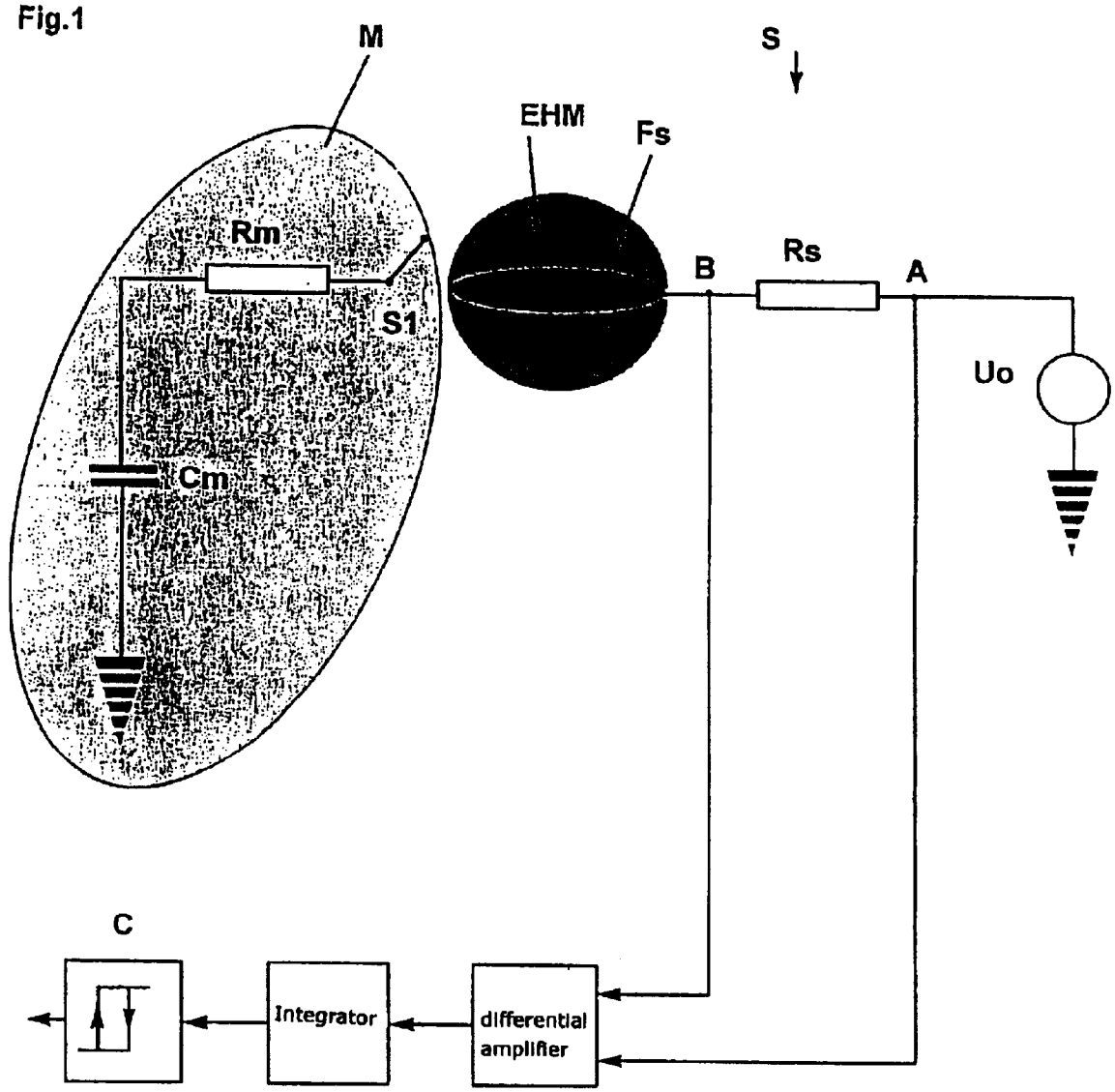
FIGS. 1 and 2 Show the functional principle of a capacitive touch sensor according to the invention.
Figure 2:
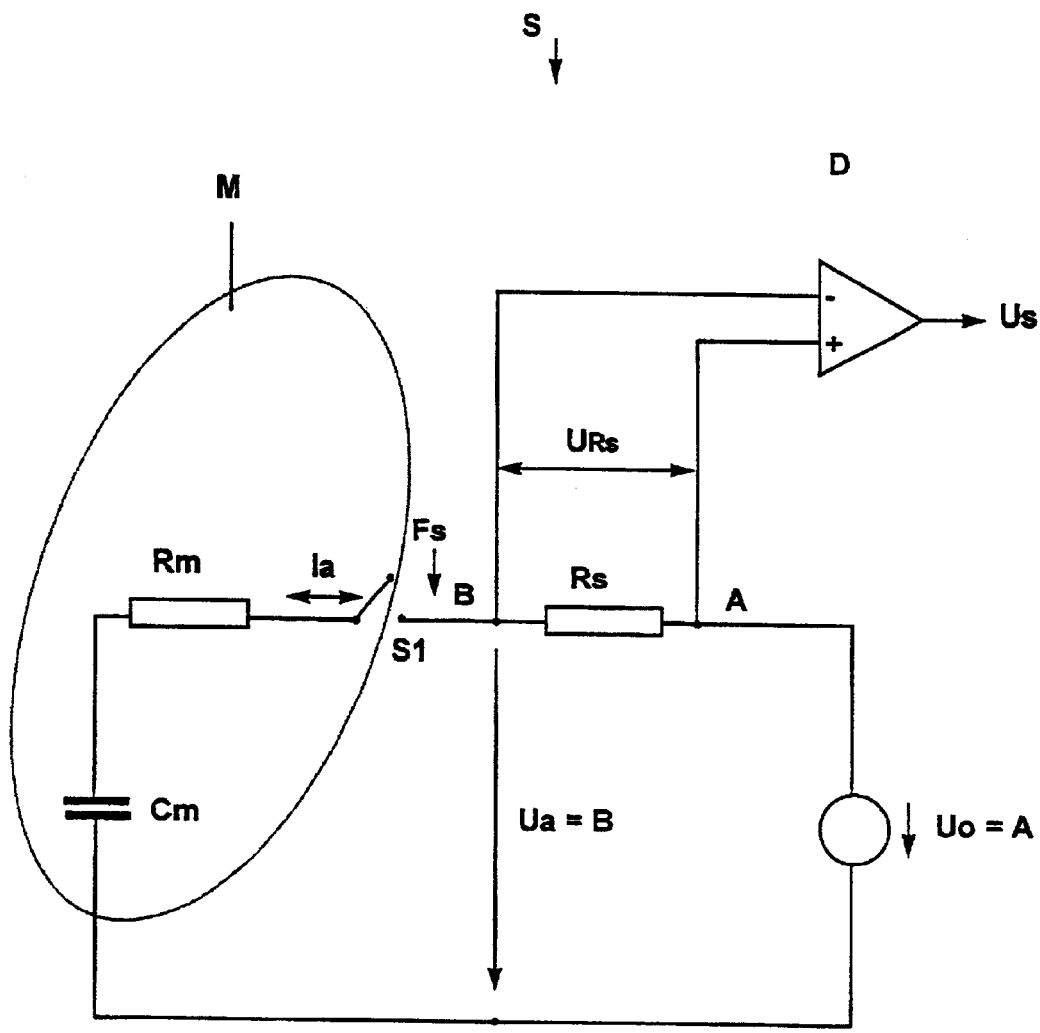

FIGS. 1 and 2 show a schematic illustration of the basic construction of a touch sensor S according to the invention, together with a simplified electrotechnical analog of a human M. According to the invention, the touch sensor S comprises a conductive sensor surface Fs which is insulated with respect to ground potential and is connected via a measuring resistor Rs to an a.c. voltage generator $U_0$, the phase shift of the voltage across the measuring resistor Rs being used as a measurement signal. The voltage across the measuring resistor Rs is evaluated by suitable signal processing electronics, comprising the differential amplifier A-B, integrator (filter) TP and comparator C. FIGS. 1 and 2 additionally show the simplified electrotechnical equivalent circuit ZM of a human body M, which in principle can be represented by means of a series-connected RC element, Rm, Cm, whose capacitor Cm is at ground potential. Likewise, the touch of the human M on the sensor surface Fs can be represented in the diagram by the switch S1, the resistor Rm being connected electrically to the sensor surface Fs and the resistor Rs when the switch S1 is closed, and being interrupted electrically from the sensor surface Fs when the switch S1 is open. The functional principle illustrated in FIGS. 1 and 2 of the touch sensor S according to the invention can be described by the following equations.

Rs: Measuring resistor  
Rm: Resistor (human) } Equivalent resistance: ZM  
Cm: Capacitor (human) } complex Uo: A.C. voltage
Us: Signal voltage
Ia: Current flow from Rm to Rs or vice versa (complex)
ω: Frequency of the alternating voltage
M: Human (complex equivalent circuit)
D: Differential amplifier (subtractor)
ZM=Rm+Cm
M=Rm+1/iω Cm;
Us=Uo−[Uo−Rs*Ia];
Us=Rs*Ia;

$$\Rightarrow \frac{Ia}{} = \frac{Uo}{Rs + (Rm + 1/i\omega Cm)};$$

Us=Uo−Uo(Rs+M);

1.) $$\underline{Us} = \frac{R_s * U_o}{Rs + (Rm + 1/i\omega Cm)};$$

for S1 = closed

2.) Us=0; for S1=open

According to the invention, by means of the touch sensor S, the presence of the complex conductance of a human body and/or a possibly superimposed impressed a.c. current (impressed interference signal, e.g. ripple voltage) is detected. In this case, the detection of the touch is carried out by measuring and evaluating the current flow Ia in the direction from the sensor to the user and/or in the direction from the user into the sensor. According to the invention, the touch sensor S is therefore based on a dual, bidirectional method, whose advantages with respect to the conventional method will be described below.

Figure 3:
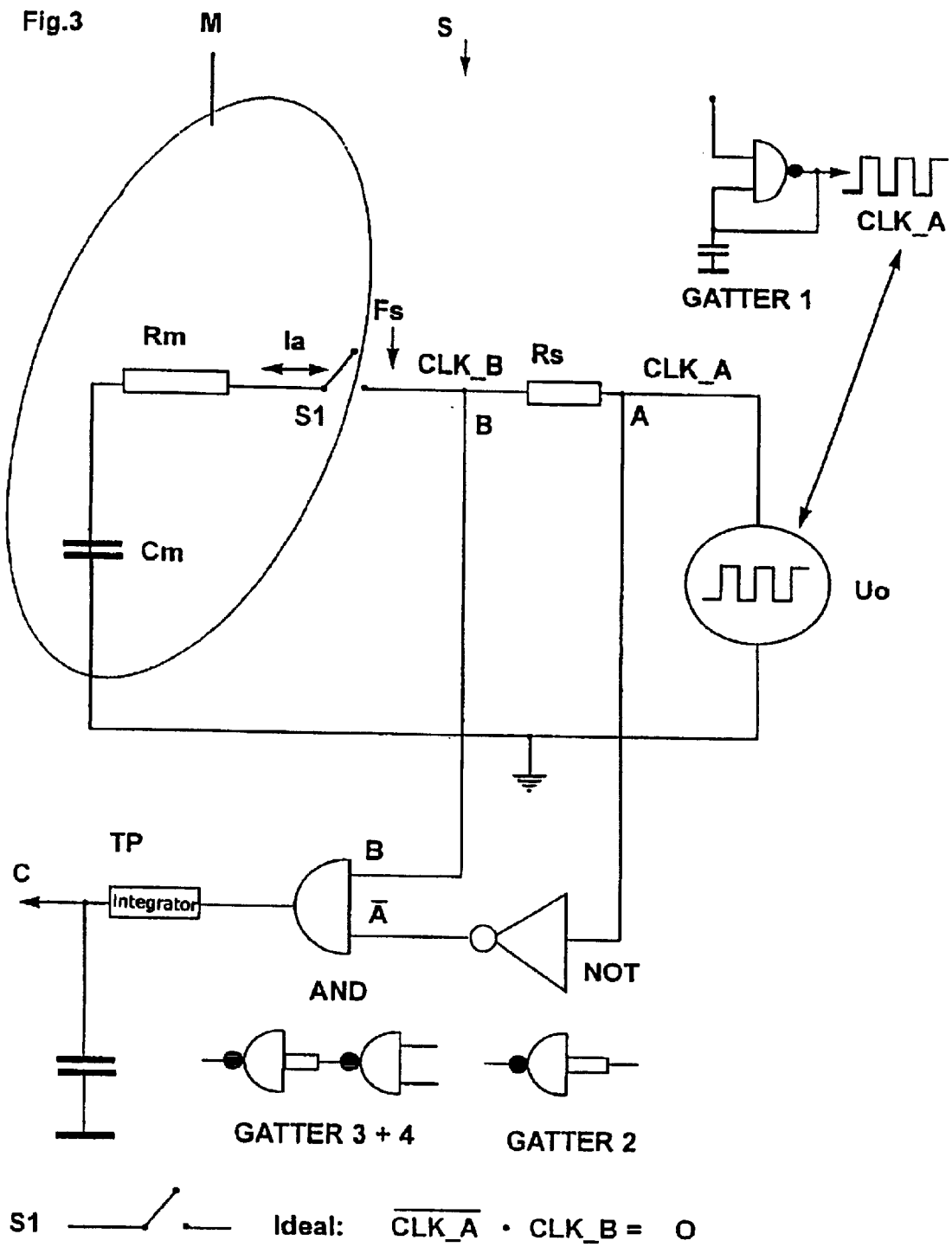
FIG. 3 Shows a first circuit diagram of a capacitive touch sensor according to the invention.

FIG. 3 shows a circuit diagram of a touch sensor S according to the invention. A grounded a.c. generator with a low voltage amplitude Uo is connected via a measuring resistor Rs to a sensor surface Fs, which also has a low-resistance d.c. connection to ground potential. The a.c. voltage generator Uo is suitably provided by means of a first gate GATE1, which is constructed in such a way that a square-wave a.c. voltage with a frequency in the region of 100 kHz is generated. According to the invention, the voltage across the measuring resistor Rs is tapped off as follows at the points A and B. A first input $\overline{A}$ of an AND circuit is connected via a NOT circuit to the point A of the measuring resistor Rs, and a second input B of the AND circuit is connected to the measuring resistor Rs on the side of the sensor surface (point B). Downstream of the AND circuit is an integrator TP, and downstream of the integrator TP is, for example, a comparator C and/or a microcontroller C, to filter out drift. In this case, the NOT circuit is provided by a second gate GATE2, and the AND circuit is provided by a third gate, GATE3, and a fourth gate, GATE4. The AND circuit and the NOT circuit cooperate as the difference element D illustrated schematically in FIG. 2. The NOT circuit inverts the sign of the voltage CLK_A and outputs the voltage $\overline{CLK\_A}$, and the AND circuit sums the voltage across its two inputs $\overline{CLK\_A}$ and CLK_B, and the result is passed on to the integrator TP and, for analysis, to the comparator C and/or downstream microcontroller C. When the switch S1 is opened, if considered in an ideal way, the phase shift between the voltage CLK_B and CLK_A is equal to 0. In reality, however, even when the switch S1 is open, a slight phase shift fH0 occurs between CLK_A and CLK_B. fH0 in FIG. 3 represents the zero signal from the sensor S according to the invention. When the switch S1 is closed, that is to say if a human M touches the surface Fs, a current Ia flows from the measuring resistor Rs in the direction of the human resistor Rm and/or from the human resistor Rm to the measuring resistor Rs, and produces a phase shift fHM which is enlarged with respect to the zero phase shift. fHM represents the output signal from the sensor according to the invention when the surface Fs is touched by a human M.

Figure 4:
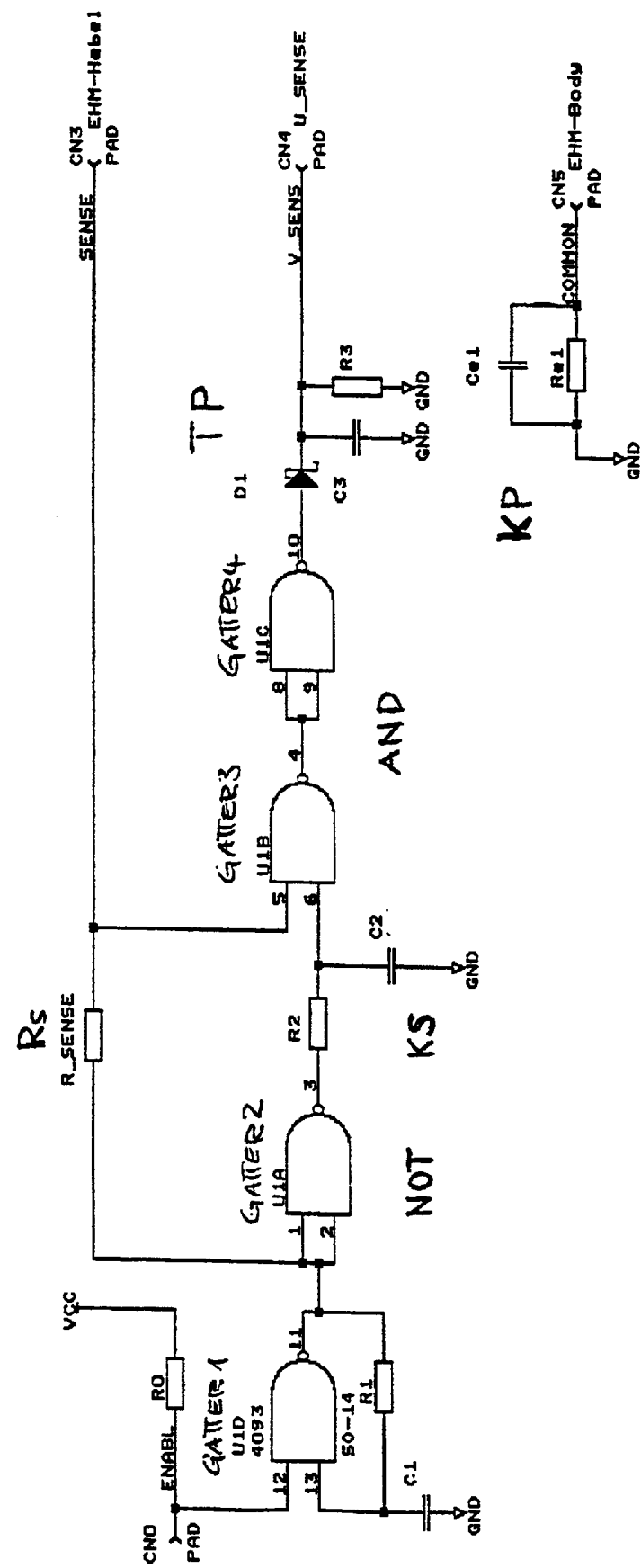
FIG. 4 Shows a second circuit diagram of a capacitive touch sensor according to the invention.

FIG. 4 shows a detailed design of the touch sensor S according to the invention, which has an integrator TP built up by means of a diode D1 and capacitor C3 and resistor R3. The zero signal and measuring signal fH0 and fHM from FIG. 3 are therefore converted into corresponding d.c. amplitudes. The output voltage Us can then be evaluated, for example in a following comparator C and/or a downstream microcontroller C. In addition, a touch sensor S illustrated in the circuit diagram of FIG. 4 has a compensation element KS, comprising the resistor R2 and the capacitor C2, for zero setting, said element being connected between the second gate GATE2 of the NOT element and the third gate GATE3 of the AND element.

The touch sensor S according to the invention described above with reference to FIGS. 1 to 4 has the following advantages over known capacitive touch sensors. The touch sensor S according to the invention is constructed extremely simply, the actual sensor element merely consisting of a nonreactive resistor RS. In addition, the signal evaluation electronics can be implemented with minimum outlay on components, exclusively by using low-cost components, and can therefore be produced simply and cost-effectively in a manner saving both space and time. In addition, the electrical connection between the sensor surface FS and the control electronics is carried out differently than in conventional capacitive touch sensors, via a single conductor which does not need to be shielded. It is therefore possible, when using the touch sensor S according to the invention, to dispense with shielded coax leads for connecting the sensor surface to the evaluation electronics, as are needed in previously known capacitive sensors. Since the sensor surface is additionally coupled with a low impedance (typically 10–20 kΩ) to the signal processing electronics, the touch sensor S is very secure against interference and insensitive with respect to external parasitic complex conductances which, for example, occur as a result of soiling of the sensor surface Fs in conventional capacitive sensors. Because of the relatively low-impedance signal link, the touch sensor S can be designed to be insensitive with respect to electromagnetic interference fields. The serviceability is virtually independent of the shape and form and the size of the sensor surface Fs, since the touch sensor S is virtually independent of the surface capacitance of the touch surface Fs to the environment, and likewise the serviceability of the touch sensor S is insensitive with respect to changes in the dielectric constant of the environment. The sensor surface Fs to be touched can therefore be designed in virtually any desired way and must actually be touched by the user in order to initiate a sensor signal. Mutually insulated subareas of the touch surface Fs for selectable different functions are likewise readily possible. In addition, the sensor is absolutely wear-free, which means that its service life is determined only by the reliability of the signal electronics, so that the statement of a minimum number of switching cycles, as needed in the case of contact switches, is dispensed with.

On the basis of the above-described advantages with respect to conventional capacitive touch sensors, in particular on account of the insensitivity with respect to changes in the dielectric constant of the environment and the insusceptibility to interference and insensitivity with respect to external parasitic complex conductances, electromagnetic compatibility, and the connection between the sensor surface Fs and the control electronics via a single non-shielded conductor, the touch sensor S according to the invention is particularly suitable for controlling modern electrically or electronically controlled sanitary fittings and to be integrated in such sanitary fittings.

Figure 5:
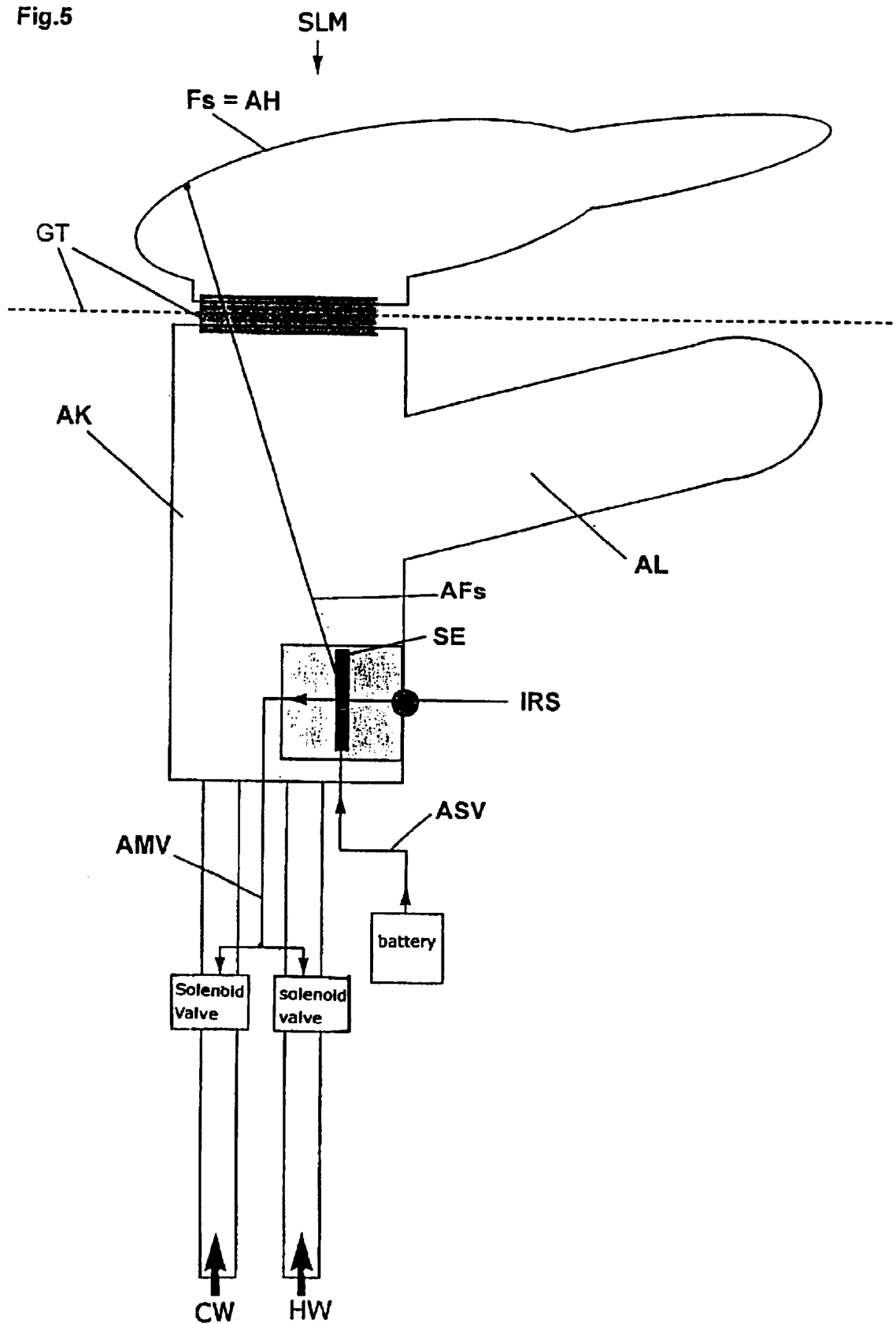
FIG. 5 shows a touch sensor according to the invention which is arranged in a sanitary fitting according to the invention.

FIG. 5 shows a sanitary fitting SLM according to the invention, into which the touch sensor S is integrated, using the example of a single-lever mixing fitting SLM having a cold water inlet CW, a hot water inlet HW each having a solenoid valve MV, a basic fitting body AK, which is connected to an outlet AL, and a mechanical valve, which is not illustrated in the drawing and which, for example, is designed as a single-lever mixing valve cartridge which can be operated via a handle AH. The operating lever AH of the fitting SLM is, according to the invention, d.c. insulated from the remaining parts of the fitting by an electrical insulator GT, and is designed as a sensor surface Fs of the touch sensor S and, via a single insulated but not shielded conductor AFs, is connected to the control electronics SE of the touch sensor S, which are arranged inside the basic body AK of the fitting. The control electronics of the touch sensor are connected in a known way to the solenoid valves MV via a connecting lead AMV and, via a second connecting lead ASV for the power supply, are connected to a battery SV which, in a suitable way, is likewise arranged inside the basic body AK of the fitting. However, the battery SV can also be arranged separately from the fitting, in this case a coupling element KP, which comprises the capacitor Ce1 and the resistor Re1 and is shown in FIG. 4, being advantageously connected between the negative terminal of the battery and the fitting housing AK. It is clear that the touch sensor S can also be supplied with power by a mains voltage source, but this is not desirable in the area of sanitary fittings, for safety reasons.

In this exemplary embodiment of the present invention, the entire handle AH of the fitting is designed as a sensor surface Fs of the touch sensor S, the control electronics SE of the touch sensor S being set such that when the handle is touched at any desired point by a hand or a finger, both solenoid valves MV are opened and, at the same time, the cold-water and warm-water feeds CW, HW are opened. In addition, an infrared sensor mechanism IRS is advantageously integrated in the fitting SLM, is likewise connected to the solenoid valves MV via control electronics and is arranged in such a way that the infrared sensor mechanism determines the status of a presence detection, for example a hand in the area of the water outlet, of the fitting, and the infrared sensor mechanism likewise controls the solenoid valves MV in a known way. Using the fitting SLM according to the invention and described above, the following operating states are possible.

1. The mechanical valve that can be operated mechanically via the handle AH is closed, the handle is not touched and the infrared sensor mechanism IRS detects no presence of a part of a body or of an object in the vicinity of the outlet area of the fitting. In this operating state, the two solenoid valves MV are likewise closed, with the result that no water emerges from the fitting.

2. The handle AH of the mechanical valve is touched by the hand at any desired point and/or the infrared sensor mechanism detects an object in the vicinity of the surroundings of the water outlet AL of the fitting, and the mechanical valve is closed. In this operating state, the control electronics of the touch sensor S detects a touch on the sensor surface Fs, and/or the control electronics of the infrared sensor mechanism detects the presence of an object or part of a body in the vicinity of the surroundings of the water outlet and the two solenoid valves MV are open, with the result that no water emerges from the fitting, since the mechanical valve is closed.

3. The valve that can be operated mechanically via the handle AH is opened, the sensor surface Fs is not touched, and the infrared sensor mechanism does not detect any object or part of a body in the vicinity or surroundings of the water outlet of the fitting. In this operating state, the mechanical valve is open and the two solenoid valves MV are closed, with the result that no water emerges from the fitting.

4. The valve that can be operated mechanically via the handle AH is opened and the handle is touched with the hand and/or the infrared sensor mechanism detects an object or a part of a body in the vicinity or surroundings of the water outlet AL of the fitting. In this operating state, both solenoid valves MV are opened and the mechanical valve is likewise opened, with the result that water emerges from the fitting.

A sanitary fitting SLM of this type provided with a touch sensor S according to the invention may therefore be operated particularly conveniently. By touching the handle AH of the mechanical valve, an operator is capable of opening both the solenoid valves MV, water emerging from the outlet of the fitting only when the mechanical valve is also opened. In this operating state, the person is enabled to reach into the water outlet region with the second hand, in order for example to test the temperature of the water, while the first hand is setting the water temperature as required by pivoting the handle. When the desired water temperature is reached and, in addition, the desired outflow quantity, which can likewise be set via the handle of the fitting, the person releases the handle, as a result of which the sensor surface Fs is no longer touched. However, as long as the operator keeps a part of the body or an object in the vicinity or surroundings of the water outlet, and therefore uses the emerging water, this is detected by the infrared sensor mechanism, and the two solenoid valves MV therefore remain open. However, if the operator removes his or her hands or the object from the detection region of the infrared sensor mechanism IRS, this is detected by the infrared sensor mechanism IRS and the two solenoid valves MV are closed, with the mechanical valve opened, so that no water enters the fitting and, consequently, no water emerges from the fitting either. This results in the particular advantage that a water outlet quantity and temperature, once set with the handle of the mechanical valve, are maintained and do not need to be set again. Instead, by means of a simple touch on the handle AH and/or by the introduction of objects or parts of a body into the vicinity of the water outlet and therefore into the detection region of the infrared sensor mechanism IRS, the solenoid valves MV are opened, and water with a preset, stored temperature and outlet quantity emerges from the fitting.

The arrangement of the touch sensor S according to the invention in a sanitary fitting is particularly advantageous since, in order to provide a sanitary fitting with the above-described operating states and the resulting advantages for activating control functions, additional mechanical switching elements, such as piezoelectric buttons or switches, and apertures, seals and the like needed for this purpose are not necessary, since the fitting body or parts of the fitting body itself are themselves the signal transmitter or sensor element. A further advantage of arranging a touch sensor S according to the invention in a sanitary fitting is that, differing from conventional touch sensors, no additional low-resistance direct connection is needed between the fitting base body and the protective conductor potential (PE).

The advantageous arrangement of a touch sensor S according to the invention in a sanitary fitting, with the design of the fitting or part of the fitting as a touch-sensitive surface connected to the sensor electronics, is in no way restricted to the above-described exemplary embodiment of a single-lever mixer SLM, and can be modified in many ways. For example, fittings can be designed with a large number of touch-sensitive, d.c.-insulated regions, which can in each case intrinsically be a touch-sensitive surface Fs of a touch sensor S for activating and deactivating different functions, such as only cold water, only hot water, test mode, sleep mode, pause function, continuous operation, run-on operation and so on. Using the touch sensor S according to the invention, fittings having more than one up to a large number of such touch-sensitive surfaces, whose contact initiates different functions, can be implemented in a simple way, it being possible, since subareas of the fitting itself function as a sensor signal transmitter, to design these to be optically pleasing, without the design of the fitting being impaired by the sensors on the fitting. In this case, the surface of the sensor surface can be designed to be electrically conductive but also electrically insulated, for example varnished, which does not impair the serviceability of the touch sensor S according to the invention, given an adequately thin insulation layer. In the case of a sensor surface S designed with an electrically insulated surface (e.g. varnished surface), this is because the change in capacitance caused by touching it is detected by the sensor S.

In addition, it is clear that the touch sensor S described above using the example of a human can also be activated by an animal which touches the sensor surface.

The touch sensor S according to the invention, when used according to the invention in sanitary fittings in a suitable way, as mentioned above, is supplied with power by a battery. Although only very little current is consumed for the operation of the touch sensor S, as compared with the solenoid valves likewise supplied with power by the battery, since it is necessary for the operation of the fitting that the sensor electronics SE look for any touch on the sensor surface Fs during continuous operation, while the solenoid valves need to be supplied with energy only when they are open/closed, it is desirable, for a long service life of the battery, to keep the current consumption of the control electronics of the touch sensor S according to the invention as low as possible. For this purpose, the invention provides a switching device, coupled to the a.c. voltage generator of the control electronics, for the alternating activation and deactivation of the a.c. voltage generator, whose mark/space ratio (cycling) is matched to the desired, tolerable reaction time, which can be predefined, for example, by the maximum frequency of successive touches on the sensor surface Fs by the finger of a human. The cycling is suitably appropriately optimized to interference-free operation (e.g. the detection of double touches) with minimum energy consumption, also predefined by the respective use of the armature (e.g. in the home, in public areas, etc.).

For smooth functioning of the touch sensor S, the control electronics can be deactivated for a time period of up to $\frac{1}{10}$ second, for example, which is followed by an activation time for the control electronics of only $\frac{1}{100}$ second. This advantageously makes it possible to reduce the power demand of the control electronics of the touch sensor S according to the invention by a multiple and, as a result, correspondingly to prolong the service life of a battery.

What is claimed is:
1. A touch sensor (S) defined by the following:
   a conductive sensor surface (Fs) insulated with respect to ground potential, the conductive sensor surface (Fs) being connected via a measuring resistor (Rs) to an a.c. voltage generator (U), a voltage difference (Us) across the measuring resistor (Rs) being used as a measuring signal, wherein a first input $(\overline{A})$ of an AND circuit is connected via a NOT circuit to a generator side of the measuring resistor (Rs); a second input (B) of the AND circuit is connected to a sensor-surface side of the measuring resistor (Rs); an integrator (TP) is connected downstream of the AND circuit; a comparator (C) and/or microcontroller (C) is connected downstream of the integrator (TP).

2. The touch sensor (S) as claimed in claim 1, defined by the following:
   the a.c. voltage generator (U) is built up by a first gate (GATE1); the NOT circuit is built up by means of a second gate (GATE2); the AND circuit is built up by means of a third gate (GATE3) and a fourth gate (GATE4).

3. The touch sensor (S) as claimed in claim 2, defined by the following:
   a zero-signal compensation element (KS) comprising a low-pass filter (R2/C2) is connected between the second (GATE2) and third gates (GATE3).

4. The touch sensor (S) as claimed in claim 2, defined by the following:
   the integrator (TP) and the comparator (C) and/or the microcontroller (C) are connected downstream of the fourth gate (GATE4).

5. A sanitary fitting (SLM), defined by the following:
   at least one touch sensor (S) as claimed in claim 1 is integrated in the sanitary fitting (SLM) and is used to control at least one solenoid valve (MV, MV) on a water feed (CW, HW) of the fitting.

6. The fitting (SLM) as claimed in claim 5, defined by the following:
   the fitting (SLM) has a manually operated operating element (AM) to open/close a mechanical value, which is connected downstream of the solenoid valves (MV) in the water feed of the fitting.

7. The fitting (SLM) as claimed in claim 5, defined by the following:
   an operating element (AH) of the fitting (SLM) is used as the sensor surface (Fs) and is connected to control electronics (SE) of the sensor S via a connecting cable (AFs); the operating element (AM) is arranged to be d.c. insulated.

8. The fitting (SLM) as claimed in claim 5, defined by the following:
   arranged in the fitting are a number of the touch sensors (S), which are each connected to different d.c.-insulated elements of the fitting (SLM) or its portions.

9. The fitting (SLM) as claimed in claims 5, defined by the following:
   in addition to the touch sensor (S), also arranged in the fitting (SLM) is an infrared reflection light barrier with control electronics (IRS) for operating the at least one solenoid valve (MV).

10. The fitting (SLM) as claimed in claim 5, defined by the following:
    sensor electronics arranged in the fitting (SLM) are supplied with energy by a battery.

11. The fitting (SLM) as claimed in claim 10, defined by the following:
the battery is arranged inside the fitting (SLM).

12. The fitting (SLM) as claimed in claim 10, defined by the following:
the negative terminal of the battery is connected to the fitting (SLM) via a coupling element (KP).

13. A method of detecting a touch on an electrically conductive surface, defined by the following:
the touch sensor (S) as claimed in claim 1 is used:
the complex conductance of a human body (M) is detected;
the touch detection is carried out by measuring and evaluating a current flow (la) in the direction from the sensor (S) to the human body (M) who touches the sensor surface (Fs), and/or in the direction from the human body (M) into the sensor.

14. The method of detecting a touch on an electrically conductive surface as claimed in claim 13, defined by the following:
a phase shift of a voltage difference (Us) across a measuring resistor (Rs), produced by touching the sensor surface (Fs), is measured by signal processing electronics comprising a differential amplifier (NOT, AND), integrator (TP) and comparator (C) and/or microcontroller (C).

* * * * *